(12) United States Patent
Valentine

(10) Patent No.: US 9,955,607 B1
(45) Date of Patent: Apr. 24, 2018

(54) ELECTRONIC EQUIPMENT VERTICAL MOUNT AND STACK RACK

(71) Applicant: Mountain Stone Technologies, LLC, Colorado Springs, CO (US)

(72) Inventor: Richard Valentine, Colorado Springs, CO (US)

(73) Assignee: Mountain Stone Technologies, LLC, Colorado Springs, CO (US)

( * ) Notice: Subject to any disclaimer, the term of this patent is extended or adjusted under 35 U.S.C. 154(b) by 0 days.

(21) Appl. No.: 15/386,937

(22) Filed: Dec. 21, 2016

(51) Int. Cl.
*H05K 7/14* (2006.01)

(52) U.S. Cl.
CPC ......... *H05K 7/1487* (2013.01); *H05K 7/1438* (2013.01); *H05K 7/1491* (2013.01); *H05K 7/1498* (2013.01)

(58) Field of Classification Search
None
See application file for complete search history.

(56) References Cited

U.S. PATENT DOCUMENTS

| | | | | |
|---|---|---|---|---|
| 4,826,115 A * | 5/1989 | Novitski | ................ | A47B 57/42 248/224.8 |
| 5,997,117 A * | 12/1999 | Krietzman | ............ | H02B 1/301 312/265.4 |
| 6,185,098 B1 * | 2/2001 | Benavides | ........... | H05K 7/1488 174/387 |
| 6,481,582 B1 | 11/2002 | Rinderer | | |
| 6,775,143 B2 | 8/2004 | Yen et al. | | |
| 7,242,394 B2 * | 7/2007 | Lahade | ................ | G06F 1/1601 178/18.01 |
| 7,298,612 B2 | 11/2007 | Malone | | |
| 8,064,200 B1 * | 11/2011 | West | ................... | H05K 7/20563 361/694 |
| 8,152,000 B2 * | 4/2012 | Wagner | ................ | H05K 7/1489 211/26 |
| 8,817,464 B2 | 8/2014 | Jau et al. | | |
| 8,854,822 B2 * | 10/2014 | Hazzard | ............... | H05K 7/1498 312/223.2 |
| 8,879,270 B2 | 11/2014 | Chen et al. | | |
| 9,030,828 B2 * | 5/2015 | Lindblad | ............... | G06F 1/1607 312/223.1 |
| 2002/0141156 A1 * | 10/2002 | Edmunds | ........... | H05K 7/20572 361/694 |

(Continued)

*Primary Examiner* — Xanthia C Cunningham
(74) *Attorney, Agent, or Firm* — BL Speer & Associates; Brenda L. Speer

(57) ABSTRACT

An electronic equipment rack is disclosed in which multiple electronic equipment components can be vertically mounted and vertically stacked within the rack. A component of electronic equipment, such as a standard rackable 1U-3U server chassis, having a configuration with its typical depth plane or dimension (z-axis) being both greater than or equal to its width plane or dimension (x-axis) and greater than its height plane or dimension (y-axis), is mounted in a vertical orientation on the rack, wherein the component is oriented and mounted on the rack such that the component's typical z-axis is substantially parallel to and in the same plane as the rack's x-axis and the component's typical x-axis is substantially parallel to and in the same plane as the rack's y-axis. Preferably, the component is further so oriented and mounted on the rack such that a user's desired surface (e.g., top or bottom) of the component's typical z-axis plane is readily accessible by the user.

27 Claims, 12 Drawing Sheets

(56) References Cited

U.S. PATENT DOCUMENTS

| | | | |
|---|---|---|---|
| 2002/0190011 A1 | 12/2002 | Caporale | |
| 2003/0039094 A1* | 2/2003 | Sarkinen | H05K 5/0017 361/679.27 |
| 2003/0223199 A1* | 12/2003 | Smith | G06F 1/181 361/727 |
| 2004/0016708 A1* | 1/2004 | Rafferty | H05K 7/1492 211/26 |
| 2004/0057216 A1* | 3/2004 | Smith | G06F 1/3203 361/724 |
| 2004/0182799 A1* | 9/2004 | Tachibana | H05K 7/20572 211/26 |
| 2004/0189161 A1 | 9/2004 | Davis et al. | |
| 2006/0157436 A1* | 7/2006 | Iwamoto | A47B 57/30 211/191 |
| 2007/0178369 A1* | 8/2007 | Conrardy | H01M 2/1077 429/100 |
| 2008/0264880 A1* | 10/2008 | Wagner | H05K 7/1489 211/26 |
| 2011/0141684 A1* | 6/2011 | Klarer | G06F 1/206 361/679.33 |
| 2011/0175503 A1* | 7/2011 | Chamarti | H05K 7/1488 312/223.2 |
| 2012/0049706 A1* | 3/2012 | Cottuli | H05K 7/20572 312/236 |
| 2012/0062084 A1* | 3/2012 | Lewis, II | H05K 5/0234 312/223.6 |
| 2012/0062091 A1* | 3/2012 | Donowho | H04Q 1/062 312/351.1 |
| 2014/0027392 A1* | 1/2014 | Crippen | H05K 7/1488 211/26 |
| 2016/0190528 A1* | 6/2016 | Conrardy | H01M 2/1077 312/265.6 |

\* cited by examiner

ELECTRONIC EQUIPMENT VERTICAL MOUNT AND STACK RACK

BACKGROUND OF THE INVENTION

Field of the Invention

The field of the invention relates to an electronic equipment rack in which multiple standard electronic equipment chassis can be vertically mounted, as opposed to horizontally mounted, and vertically stacked within the rack, without any modification required to the electronic equipment chassis being so mounted.

Description of Related Art Including Information Disclosed Under 37 CFR 1.97 and 37 CFR 1.98

A key disadvantage of prior art server racks is the servers are installed into or mounted on a rack in a horizontal axis configuration and then vertically stacked from top to bottom in the rack. This requires the storage space area within the rack to be at least as deep as the server when horizontally installed on the rack. However, this further means that the space where the rack is placed must be at least twice the depth of the rack, or as defined and used herein, a "standard storage space area," so that an installed server can be slid out and removed from the rack in order to service the server in any manner. In addition, space at the back of the rack must be reserved, which is typically an area about a width of the rack and by about at least 1" or 2.5 cm in depth, for servicing physical power connections and including cabling and associated wiring harnesses that provide power and communications to the servers contained within the rack.

Another disadvantage of prior art server racks is proprietary rails that allow the server to be slid in and out for installation and maintenance must be designed for each server type in order to maintain standard clearances for installing into server racks.

Some prior art server storage racks allow for a server to be installed into or mounted on a rack in a vertical axis configuration and then horizontally stacked from side to side in the rack. Optionally, multiple rows of such horizontally stacked servers in turn can be vertically stacked upon each other from top to bottom in the rack. However, yet again, usually the storage space area for the rack must be at least twice the depth of the server, or a standard storage space area, so that an installed server can be slide out and removed from the rack in order to service the server in any manner.

U.S. Pat. No. 6,481,582 issued Nov. 19, 2001, by Rinderer for "Rack" discloses a rack, especially for holding units of electrical equipment one above another, comprising an open rectangular frame having opposite faces. The frame comprises a base, sides constituted by channels, a head and feet on the base for standing it upright, components being configured to be self-squaring for facilitating assembly. Components are mounted on the rack in a horizontal axis configuration and vertically stacked and the rack would require a standard storage space area.

U.S. Pat. No. 6,775,143 issued Aug. 10, 2004, by Yen et al. for "Server Apparatus" discloses a server apparatus, comprising a case, a backboard, a signal-exchange device and a plurality of computer devices. There are two breaches on the front and the back of the case, and there is a plurality of symmetric guiders in the vertical inner side. The backboard has two faces, one sticking on the breach of the back of the case and there is a plurality of connect-slots, each slot connecting the others through electric signals. The back of the signal exchange device and computer device respectively sets at least a first and second connector and the vertical width of the signal-exchange device is smaller than the width of the guider; thereby, a user can set the signal-exchange and computer device into the symmetric guiders. While the computer device and the signal-exchange device completely slide into the case, the first connector and the second connector wedge in the corresponding connect-slots. Components are mounted on the rack in a vertical axis configuration and horizontally stacked and in turn can be vertically stacked and the rack would require a standard storage space area.

U.S. Pat. No. 7,289,612 issued Nov. 20, 2007, by Malone for "Server with Vertical Drive Arrangement" discloses a planar backplane arranged in a horizontal orientation in a server configured for rack mounting. The planar backplane is configured to accept and mount a plurality of disk drives in a vertical orientation in a dense server arrangement. Components are mounted on the rack in a vertical axis configuration and horizontally stacked and in turn can be vertically stacked and the rack would require a standard storage space area.

U.S. Pat. No. 8,817,464 issued Aug. 26, 2014, by Jau et al. for "Server System" discloses a server system that includes a rack, a power supply module, a switch, and a plurality of servers. The rack can be divided into a plurality of rack units. The rack units are parallel to each other and vertically arranged. The power supply module and the switch are disposed in close proximity to each other in at least one of the rack units. The power supply is adjacent to the rear side of the rack. The switch is adjacent to the front side of the rack. Each of the servers is disposed in one of the other rack units and electrically connected to the power supply module and the switch. Components are mounted on the rack in a horizontal axis configuration and vertically stacked and the rack would require a standard storage space area.

U.S. Pat. No. 8,879,270 issued Nov. 4, 2014, by Chen et al. for "Rack Mountable Server Apparatus" discloses a rack mountable server apparatus disposed on a plane of a rack. The rack mountable server apparatus includes a chassis and a plurality of server units. The chassis is disposed in the rack, and the appearance of the chassis is a rectangular cuboid. When the chassis is installed in the rack, a first surface constructed by a length and a width of the chassis is parallel to the plane. The server units are disposed in the chassis. Each of server units has a circuit board, and the circuit boards are arranged parallel to a second surface which is constructed by the length and the height of the chassis or the width and the height of the chassis, and are perpendicular to the first surface. Components are mounted on the rack in a vertical axis configuration and horizontally stacked and in turn can be vertically stacked and the rack would require a standard storage space area.

U.S. Patent Application 20020190011 issued Dec. 19, 2002, by Caporale for "Rack System with Minimum Dead Space" discloses a rack system for minimizing dead space that includes a frame having a top, a device to be housed, and at least two ears adapted to horizontally secure the device from the top. The ears may be fastened directly to the top of the frame or fastened to two parallel horizontal rails which are braced to the top of the frame. The device is attached to each ear such that the device is parallel to the horizontal rails. The device's position relative to the top of the frame may be adjusted due to vertical slots in a side flange of each of the ears. An alternative embodiment includes a rack system having a frame with a top, a device to be housed, and a tray upon which the device may horizontally sit. The tray is fastened directly to the top of the frame or fastened to two parallel horizontal rails which are braced to the top of the frame. An additional clamp may be provided to secure the device between the tray and the clamp. Methods and kits for minimizing dead space in rack systems are also provided. A component is mounted on the rack in a horizontal axis configuration and the rack would require a standard storage space area.

U.S. Patent Application 20040189161 issued Sep. 30, 2004, by Davis et al. for "Zero Rack Unit Space Utilization" discloses an enclosure that stores accessories for computer-related devices in zero unit space. The enclosure comprises a frame with horizontal and vertical members coupled with frame tracks. The frame supports computer-related devices, such as server blades, in a rack unit space. The computer-related devices, being supplied by different vendors, have varying sizes, shapes, and attachment requirements. The frame tracks are adapted to attach accessories, such as a power source, a cooling device, or a wire guide, in a zero rack unit space. The frame is configured according to the EIA-310-D standard. The accessories and computer-related devices are mounted to the frame and the frame tracks using tool-less adapters. Components are mounted on the rack in a horizontal axis configuration and vertically stacked and the rack would require a standard storage space area.

There are known options to increase the number of components that may be mounted on a rack in order to maximize the utilization of a standard storage space area. However, if less than a standard storage space area is available, then there is a need for a rack upon which a user is able to mount and stack multiple components in order to maximize the utilization of a less than standard storage space area.

BRIEF SUMMARY OF THE INVENTION

The electronic equipment vertical mount and stack rack of the present invention comprises at least two vertical posts, wherein the vertical posts are substantially parallel to each other; at least a horizontal rail, wherein the horizontal rail is substantially perpendicularly attached to each of the vertical posts, further wherein the vertical posts and horizontal rail form an electronic equipment vertical mount and stack rack; at least two channel rails, wherein each channel rail is substantially perpendicularly attached to each of the vertical posts; a base, wherein the base is substantially perpendicularly attached to each of the vertical posts at a bottom end of the vertical posts; and a top, wherein the top is substantially perpendicularly attached to each of the vertical posts at a top end of the vertical posts and is capable of having at least an electronic equipment component mounted thereon.

The vertical posts, horizontal rail, channel rails, optional base and optional top are configured to form a rack with at least a bay; further wherein the rack is capable of having mounted thereon at least an electronic equipment component oriented and mounted in a vertical orientation on the rack by means of the channel rails, such that the component's typical z-axis is substantially parallel to and in a same plane as the rack's x-axis and the component's typical x-axis is substantially parallel to and in a same plane as the rack's y-axis; and further wherein the rack is capable of having mounted thereon at least another electronic equipment component which is vertically stacked on the rack in relation to the other mounted electronic equipment component. The rack can accommodate in a vertical orientation at least an electronic equipment component selected from the group consisting of a standard server chassis, a standard telecommunications chassis and a standard networking chassis, which chassis is horizontally oriented and adheres to either an Electronic Industries Alliance EIA-310-D standard or a Consumer Electronics Association CEA-310-E standard without modification to said chassis.

The channel rail of the rack may further comprise at least a groove, at least a notch and at least a lip to retain an electronic equipment component mounted on the channel rail. Additionally, a pin-retainer may be inserted into and spring loaded within the channel rail to secure a mounting apparatus of a standard server chassis or other Standard Width electronic equipment to the channel rail.

The rack may further comprise at least a hardware rail attached to the horizontal rail; wherein at least a non-Standard Width electronic equipment component is mounted on the rack by means of the hardware rail. At least a vertical cable management means may be attached to the hardware rail. At least a horizontal cable management means may be attached to the hardware rail.

In other embodiments, the rack may further comprise at least an attachment tab on the vertical posts and at least a side extension attached to the attachment tab, wherein the side extension is capable of having mounted thereon an electronic equipment component; at least two wheels attached to the base to provide for a mobile rack; a patch panel mount capable of having a patch panel mounted thereon; and a hardware mount capable of having an electronic equipment component mounted thereon.

BRIEF DESCRIPTION OF THE SEVERAL VIEWS OF THE DRAWINGS

FIG. 1 is various views of a rack of the present invention; wherein FIG. 1A is a front plan view of the present invention having no electronic equipment mounted, FIG. 1B is a front plan view of a front of the rack of the present invention having various electronic equipment components mounted and stacked on the rack, and FIG. 1C is a right side plan view of the rack of the present invention.

FIG. 2 is various views of the rack of the present invention; wherein FIG. 2A is an inset view of a top area of the rack of the present invention at a point where a top rail, a vertical rail, a horizontal rail, and a side extension conjoin (see encircled area 'A'), FIG. 2B is an inset view of a bottom area of the rack of the present invention where a base, a channel, a pin-retainer and a vertical rail conjoin (see encircled area 'B'), FIG. 2C is a right side plan view of the rack of the present invention, and FIG. 2D is a perspective view of the rack of the present invention.

FIG. 3 is various views of a side extension of the rack of the present invention; wherein FIG. 3A is a perspective view of the side extension, FIG. 3B is a back plan view of the side extension, FIG. 3C is a top plan view of the side extension, FIG. 3D is an outside side plan view of the side extension, FIG. 3E is an inside side plan view of the side extension, and FIG. 3F is a front perspective view of the rack of the present invention having at least a side extension mounted thereon (see encircled area 'A').

FIG. 4 is various views of a channel rail of the rack of the present invention; wherein FIG. 4A is a bottom plan view of the channel rail, FIG. 4B is a back plan view of the channel rail, FIG. 4C is a front plan view of the channel rail, FIG. 4D is an end plan view of the channel rail, FIG. 4E is a bottom perspective view of the channel rail, and FIG. 4F is a back bottom perspective view of the channel rail.

FIG. 5 is various views of a channel rail and a pin-retainer of the rack of the present invention; wherein FIG. 5A is a perspective view of the pin-retainer, FIG. 5B is a back or front mirror image plan view of the pin-retainer, FIG. 5C is a top or bottom mirror image plan view of the pin-retainer, and FIG. 5D is a perspective view of the pin-retainer within the channel rail.

FIG. 6 is various views of a horizontal rail of the rack of the present invention, wherein FIG. 6A is a top or bottom mirror image plan view of the horizontal rail, FIG. 6B is a back perspective view of the horizontal rail, FIG. 6C is an end plan view of the horizontal rail, FIG. 6D is a back plan view of the horizontal rail and FIG. 6E is a perspective view the rack of the present invention having at least a horizontal rail mounted thereon.

FIG. 7 is various views of a vertical post of the rack of the present invention; wherein FIG. 7A is a perspective view of the vertical post, FIG. 7B is an inside side plan view of the vertical post, FIG. 7C is a left or right front mirror image plan view of the vertical post, FIG. 7D is an outside side plan view of the vertical post, and FIG. 7E is an end plan view of the vertical post, and FIG. 7F is an inset view (see encircled area 'F') of mounting holes within the vertical post which are used to mount a horizontal rail to the vertical post.

FIG. 8 is various views of a top bar of the rack of the present invention; wherein FIG. 8A is a perspective view of the top bar, FIG. 8B is a front or back mirror image plan view of the top bar, FIG. 8C is a top plan view of the top bar, FIG. 8D is an end plan view of the top bar, and FIG. 8E is a perspective view of the rack of the present invention having a top bar mounted thereon.

FIG. 9 is various views of a hardware rail of the rack of the present invention; wherein FIG. 9A is a perspective view of the hardware rail, FIG. 9B is a top or bottom mirror image plan view of the hardware rail, FIG. 9C is a front plan view of the hardware rail, FIG. 9D is an end plan view, and FIG. 9E is a perspective view of the rack of the present invention having at least a hardware rail mounted thereon.

FIG. 10 is various views of a base of the rack of the present invention; wherein FIG. 10A is a perspective view of the base, FIG. 10B is a top plan view of the base, FIG. 10C is a front plan view of the base, FIG. 10D is a side view of the base, and FIG. 10E is a perspective view of the rack of the present invention having a base attached to at least a vertical rail thereof.

FIG. 11 is various views of alternative bay embodiments of the rack of the present invention without the base; wherein FIG. 11A is a perspective view of the rack having more than a bay, FIG. 11B is a front plan view of the rack having more than a bay, FIG. 11C is a perspective view of the rack having a bay, and FIG. 11D is a front plan view of the rack having a bay.

FIG. 12A is a plan view of a rack having four bays, FIG. 12B is a plan view of a rack having three bays, FIG. 12C is a plan view of a rack having two bays, FIG. 12D is a plan view of a rack having one bay, and FIG. 12E is a perspective view of a rack having three bays.

LIST OF REFERENCE NUMERALS

Figures 1, 1A, 1B, 1C:
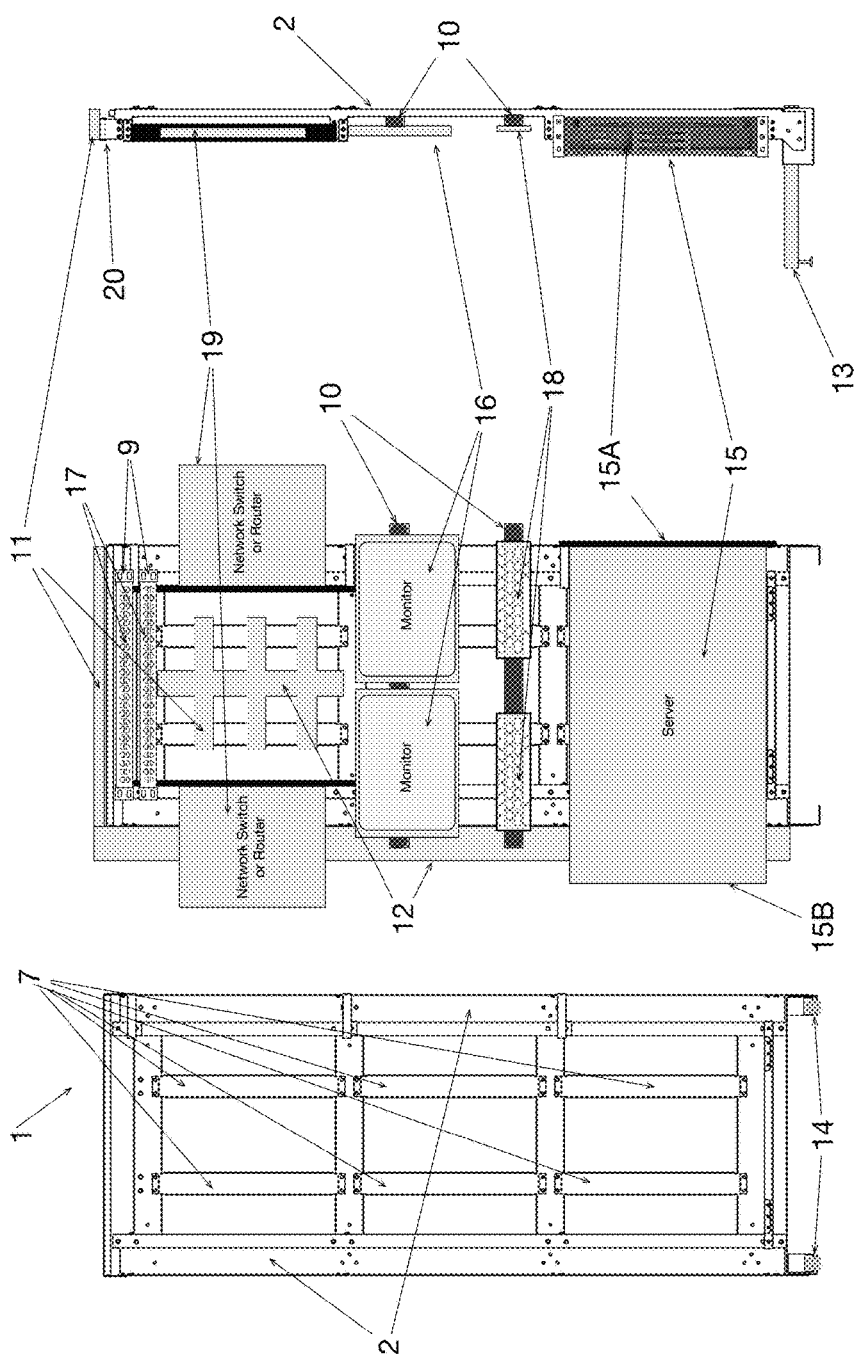

1 rack
2 vertical post
3 horizontal rail
4 channel rail
5 pin-retainer
6 base
7 hardware rail
8 side extension
9 patch panel mount
10 hardware mount
11 horizontal cable management means
12 vertical cable management means
13 feet
14 wheels
15 server, 15A server front, 15B server back
16 monitor
17 patch panel
18 keyboard
19 network switch
20 top bar
21 bay-1
22 bay-2
23 bay-3
24 bay-4
25 attachment tab

DETAILED DESCRIPTION OF THE INVENTION

In the present invention, an electronic equipment rack to mount standard electronic equipment chassis, including but not limited to the Electronic Industries Alliance EIA-310-D standard and the Consumer Electronics Association CEA-310-E standard, wherein a standard unit of measure of 1U equates to about 1.75" or about 44.45 mm, is disclosed in which multiple electronic equipment components can be vertically mounted and vertically stacked within the rack. As an example, a component of electronic equipment, such as a server, having a configuration in which its typical depth plane or dimension (z-axis) is both greater than or equal to its typical width plane or dimension (x-axis) and greater than its typical height plane or dimension (y-axis), is mounted in a vertical orientation in the rack, wherein the component is oriented and mounted on the rack such that the component's typical z-axis is parallel to and in the same plane as the rack's x-axis and the component's typical x-axis is parallel to and in the same plane as the rack's y-axis. Preferably, the component is further so oriented and mounted on the rack such that a user's desired surface (e.g., top or bottom) of the component's typical z-axis plane is readily accessible by a user.

In a preferred embodiment of a mount rack of the present invention, the rack mounts to a flat vertical surface such as a wall or door, or even may be slide-ably and removably inserted inside a cubicle wall, bookcase, or storage cabinet in a vertical configuration. In an alternative embodiment of the mount rack of the present invention, the rack may be mounted to or free-standing on a horizontal surface such as a floor, and stationary. In another alternative embodiment of the mount rack of the present invention, the rack may be free-standing upon feet and stationary, or may be free-standing upon wheels, such as caster wheels, and mobile. In another alternative embodiment of the mount rack of the present invention, the rack may be mounted in a mobile vehicle such as a recreational vehicle, a mobile command vehicle, an ocean-going vessel, an aircraft, or any other vehicle with physical space constraints.

The rack may be constructed of any suitable material that is durable, strong and capable of supporting the weight of electronic equipment components mounted on the rack. Illustrative and non-limiting examples of suitable materials are plastics, metals, alloys and wood, with a preferred materials being steel and stainless steel.

Figure 12:
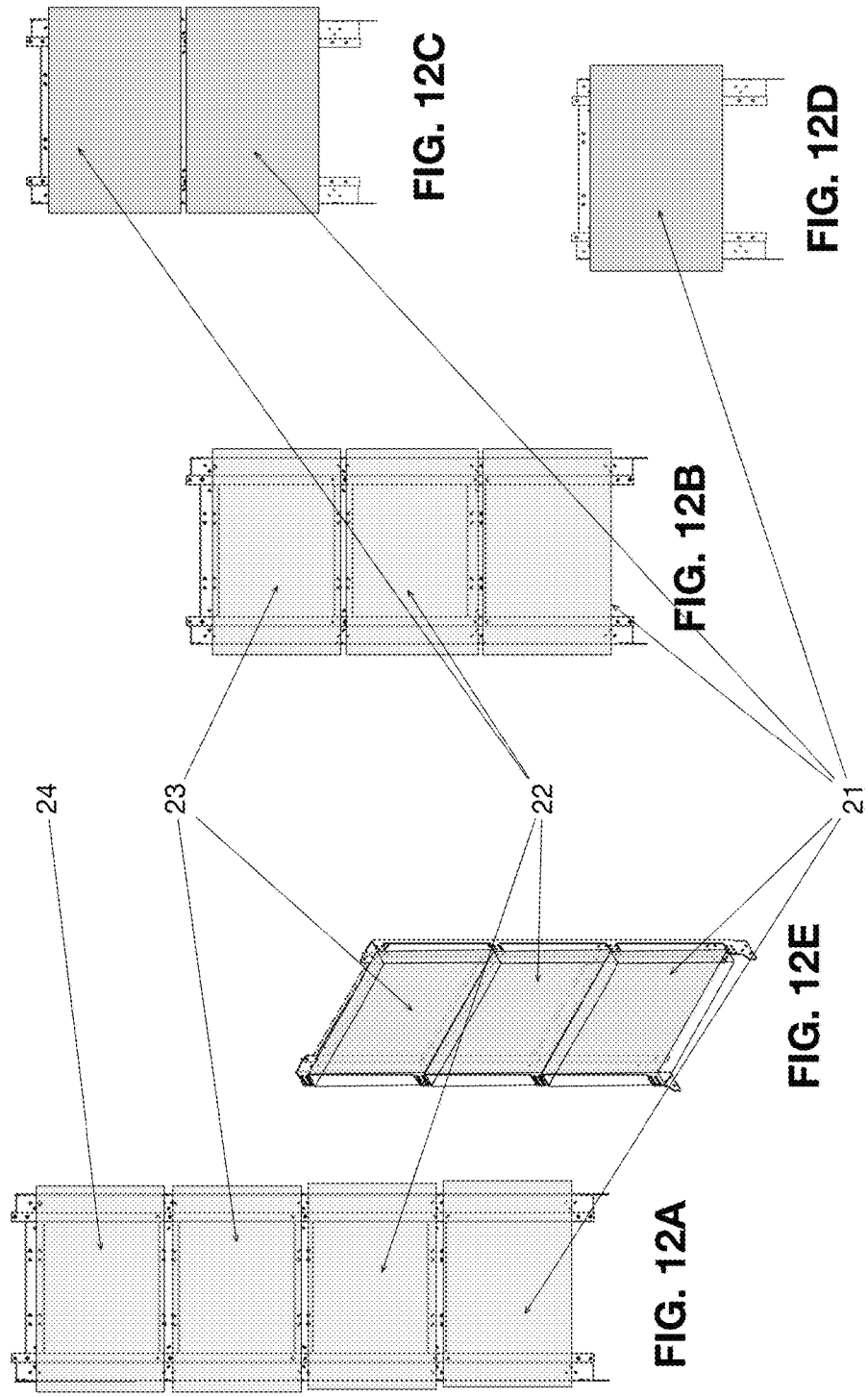
FIG. 12 is various views of alternative configurations of the rack of the present invention; wherein each bay is shaded

With reference to FIG. 1 through FIG. 12, a rack 1 of the present invention may have at least one bay 21 and as many as four bays 22, 23, 24 configurations as shown in FIG. 12.

A bay 21, 22, 23, 24 is an area or space within the rack 1 of the present invention sufficient to attach a standard server to the rack 1 and is used as a measurement of scale when sizing a rack 1 of the present invention, for example, 1-bay (FIG. 12D), 2-bay (FIG. 12C), 3-bay (FIG. 12B, FIG. 12E) or 4-bay (FIG. 12A).

The rack 1 of the present invention enables a user to take advantage of space-constrained locations and to mount electronic equipment (such as servers, networking gear, switches, monitors, keyboards, patch panels or any other suitable electronic equipment component of a user's choice) which is typically designed to be mounted horizontally in a vertical orientation, but instead to mount such equipment on the rack 1 of the present invention in a vertical orientation and to vertically stack the equipment on the rack 1. The rack 1 of the present invention also is engineered to allow for vertical and horizontal cabling management of electronic components mounted on the rack 1.

The rack 1 of the present invention is readily adaptable for mounting of various electronic equipment on the rack 1 and installation of the rack 1 in various environments. For example, the rack 1 also may have optional brackets (not shown) that are able to be adapted or modified for mounting electronic equipment components of a user's choice on the rack 1. The rack 1 of the present invention may also have an optional mounting or installation apparatus (not shown) allowing the rack 1 to be securely mounted or installed in a mobile vehicle.

With reference to the drawings, a rack 1 of the present invention is shown in FIG. 1, FIG. 1A, FIG. 1B, and FIG. 1C, with FIG. 1B and FIG. 1C having optional electronic equipment components mounted thereon, such as a monitor 16, a patch panel 17 (for connection to telephony sources), a keyboard 18, and a network switch 19; further wherein the patch panel 17 may be attached to and secured upon the rack 1 by means of a patch panel mount 9 and each of the monitor 16 and the keyboard 18 may be attached to and secured upon the rack 1 by means of a hardware mount 10. The rack 1 of the present invention preferably is designed in accordance with and accommodates the Electronic Industries Alliance EIA-310-D standard and the Consumer Electronics Association CEA-310-E standard which defines a 19" width standard for electronic equipment (hereinafter defined and referred to as "Standard Width").

With reference to FIG. 1 through FIG. 11, the various components of the rack 1 are shown and discussed in turn. Each component has a specific function to enable electronic equipment to be secured, steadied, reinforced or mounted on the rack 1.

Figure 2:
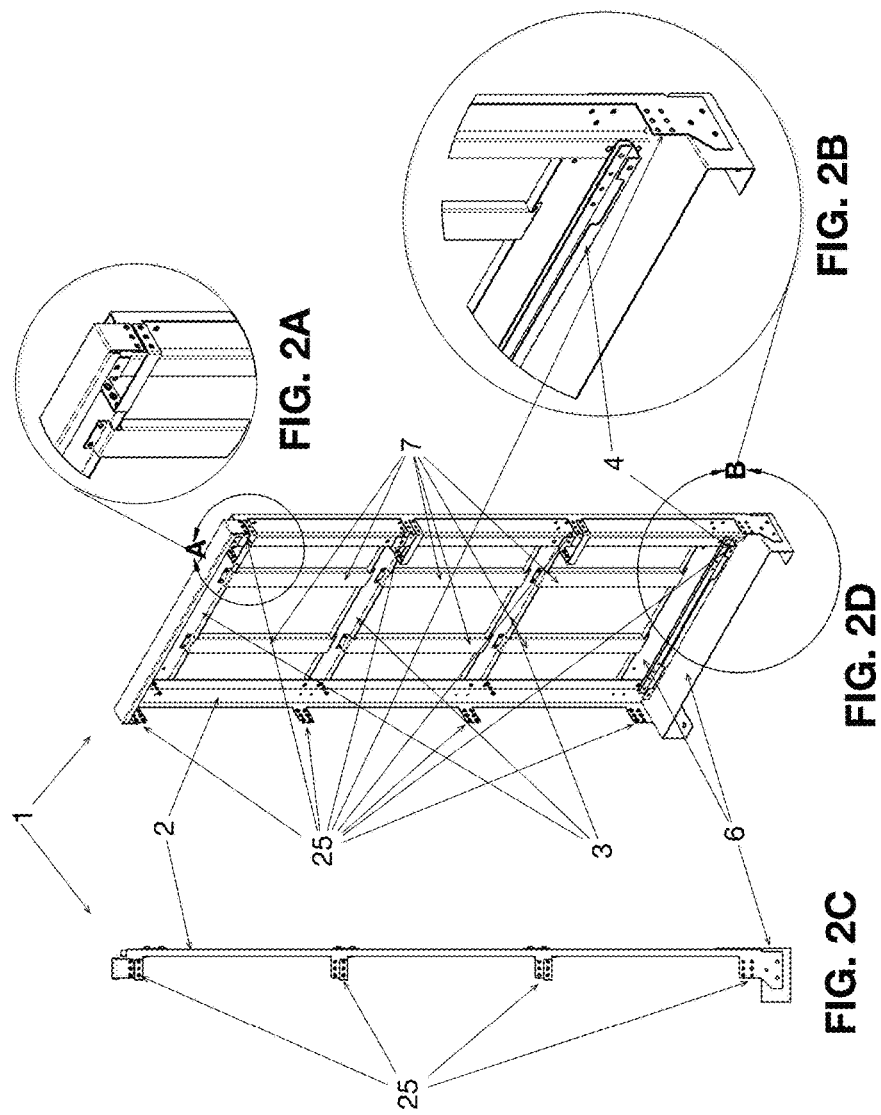
Figure 3:
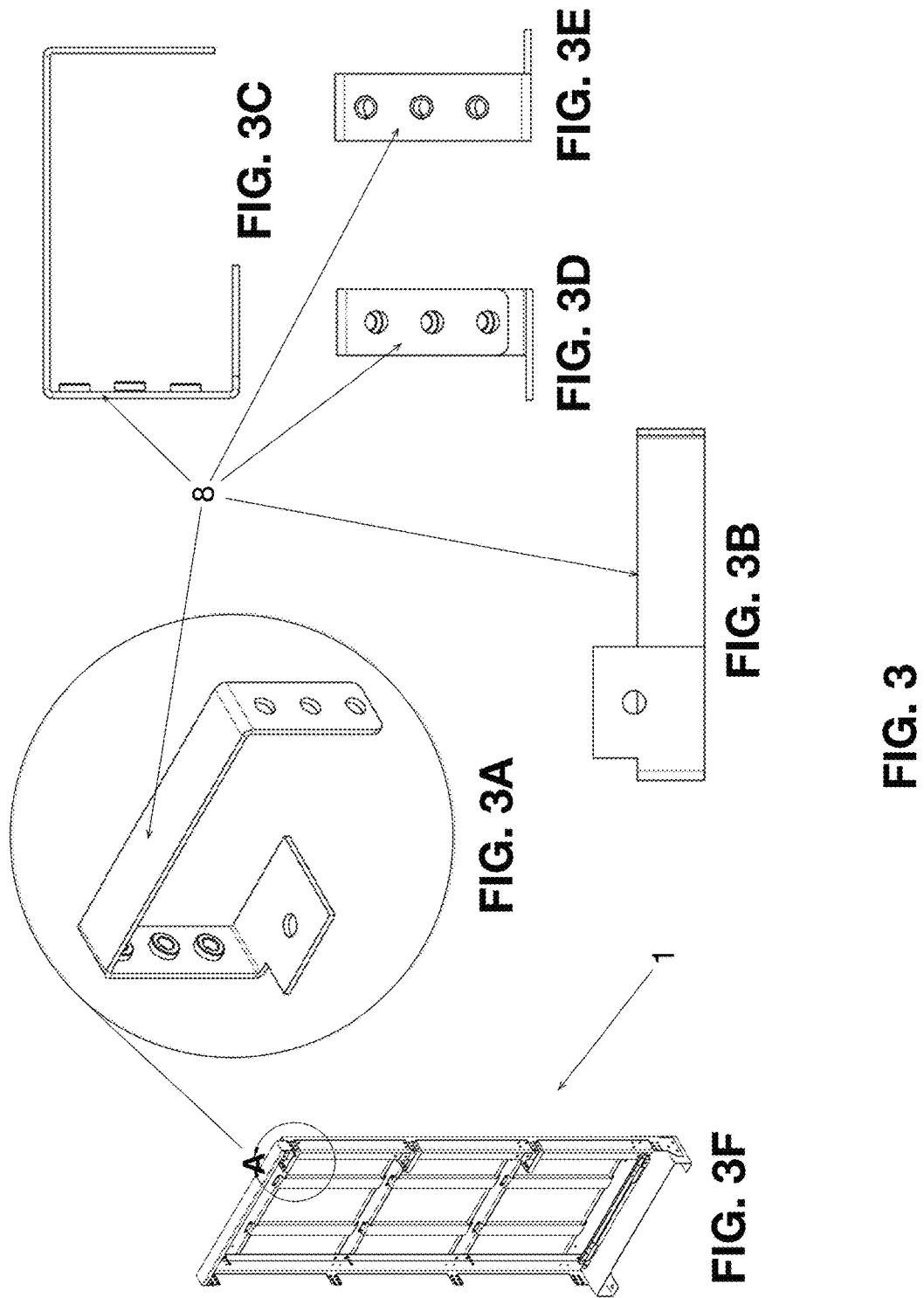
Figure 4:
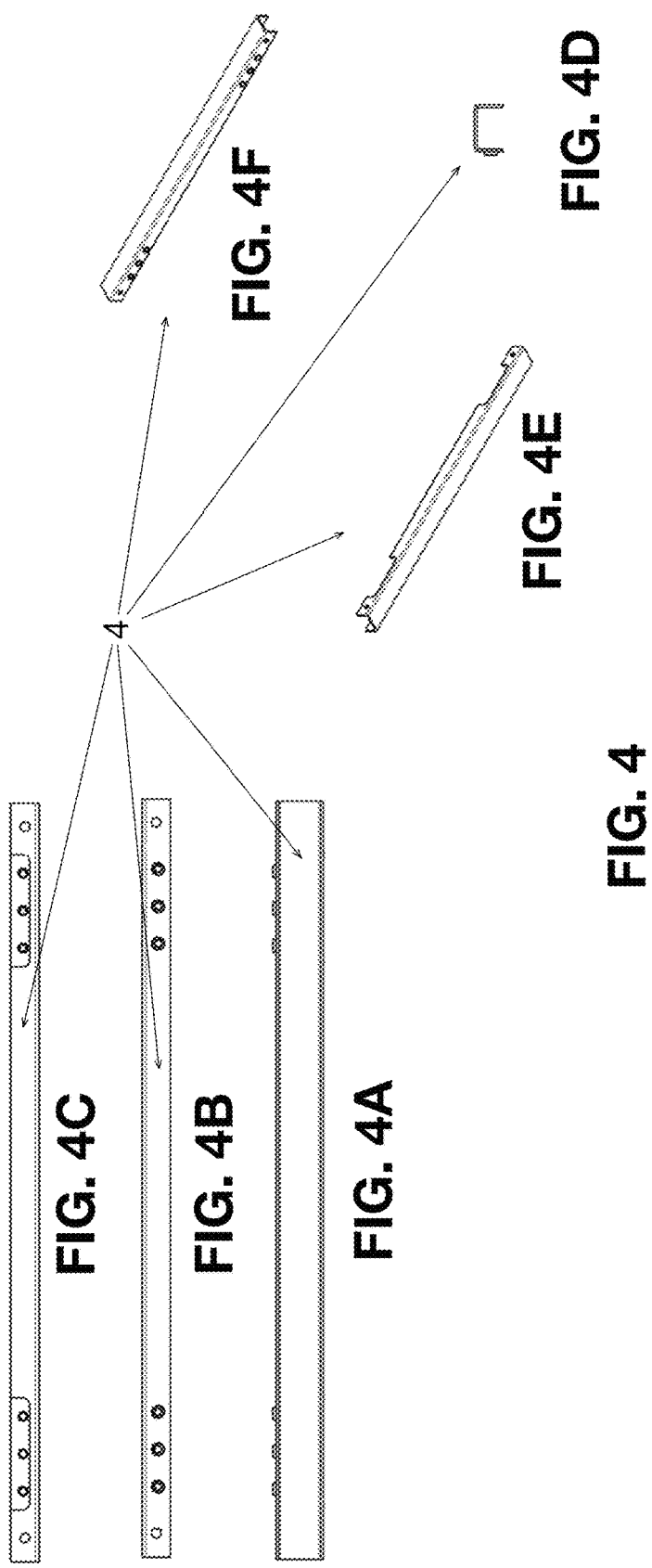
Figure 5:
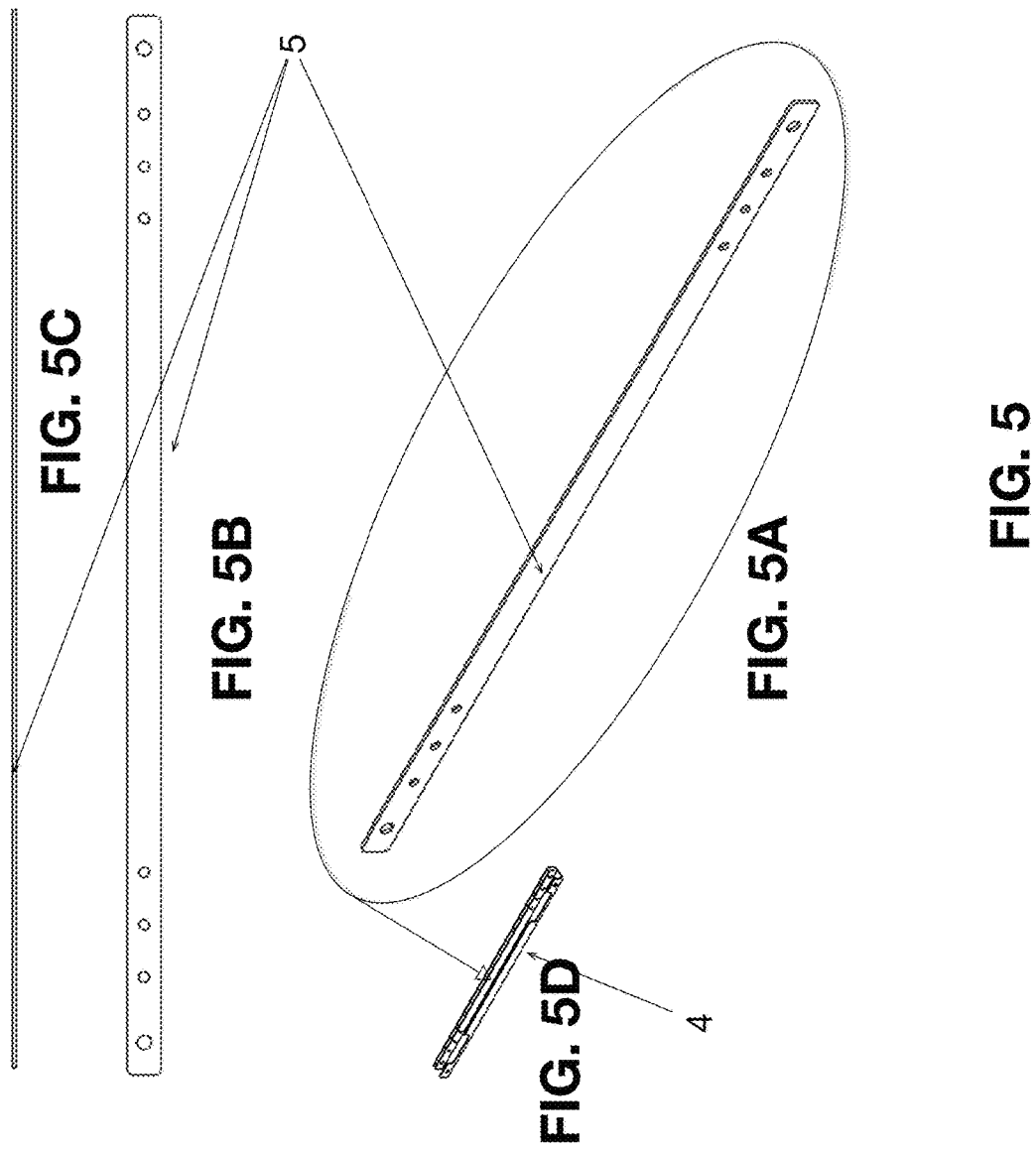
Figure 6:
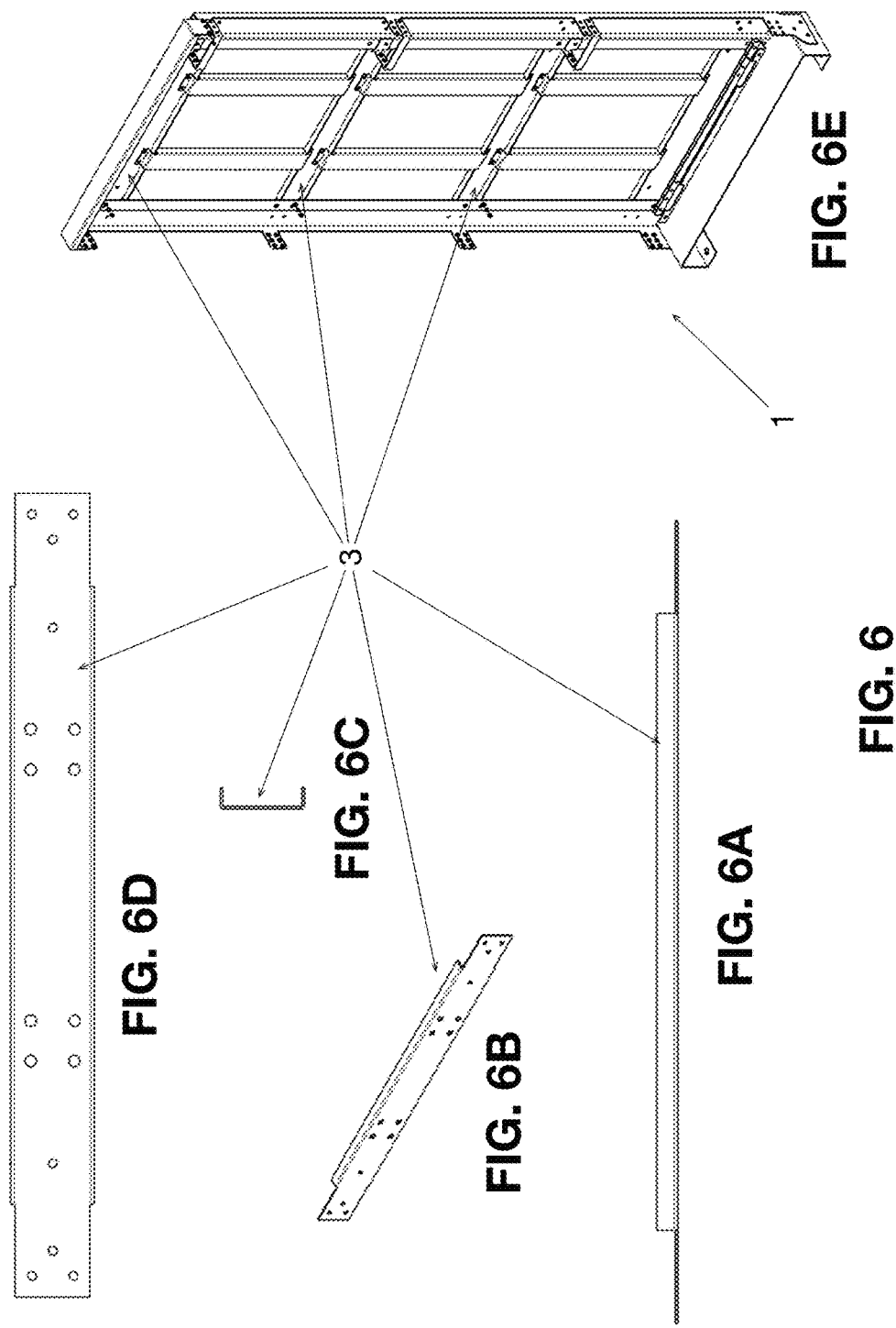
Figure 7:
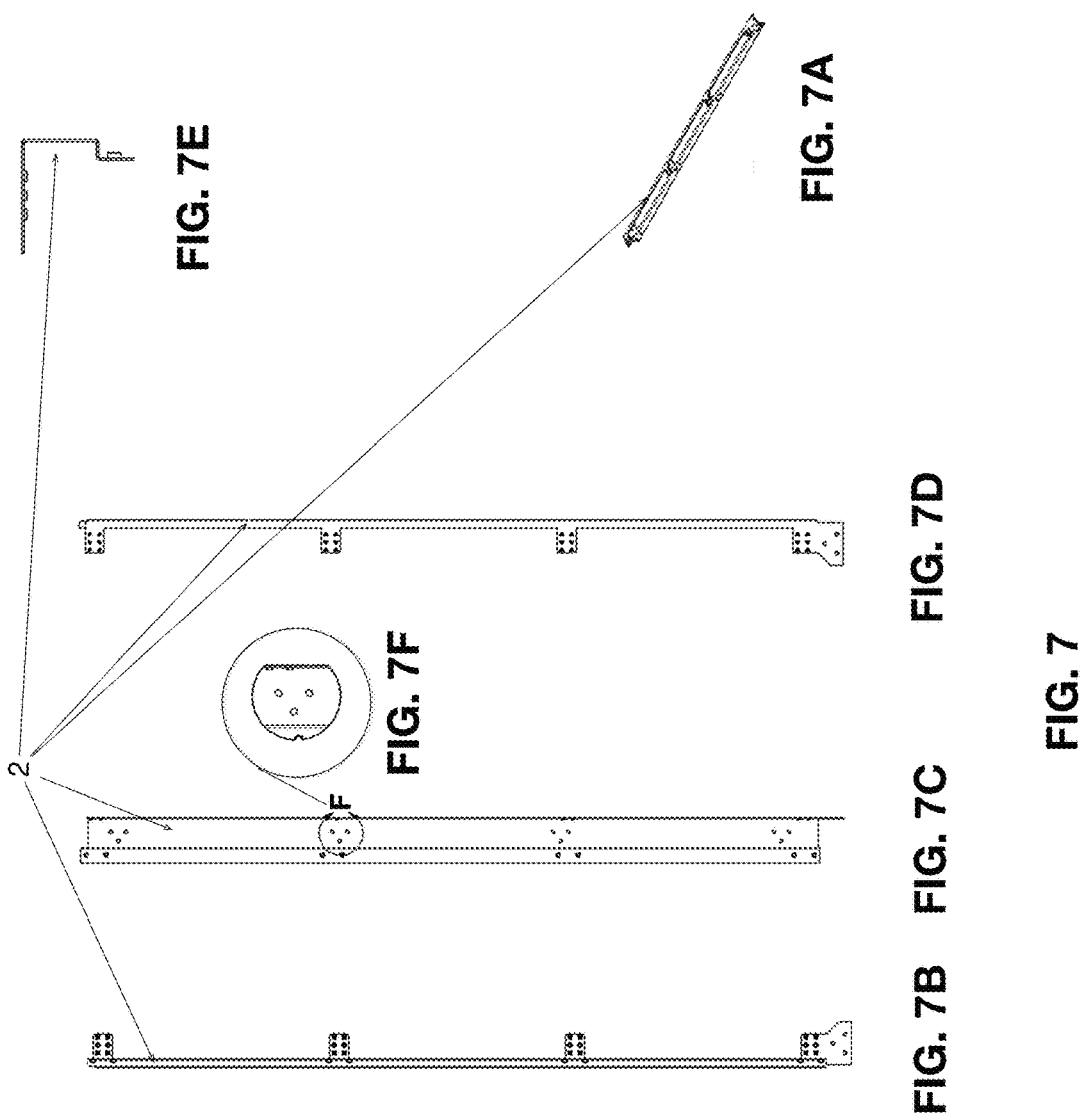
Figure 8:
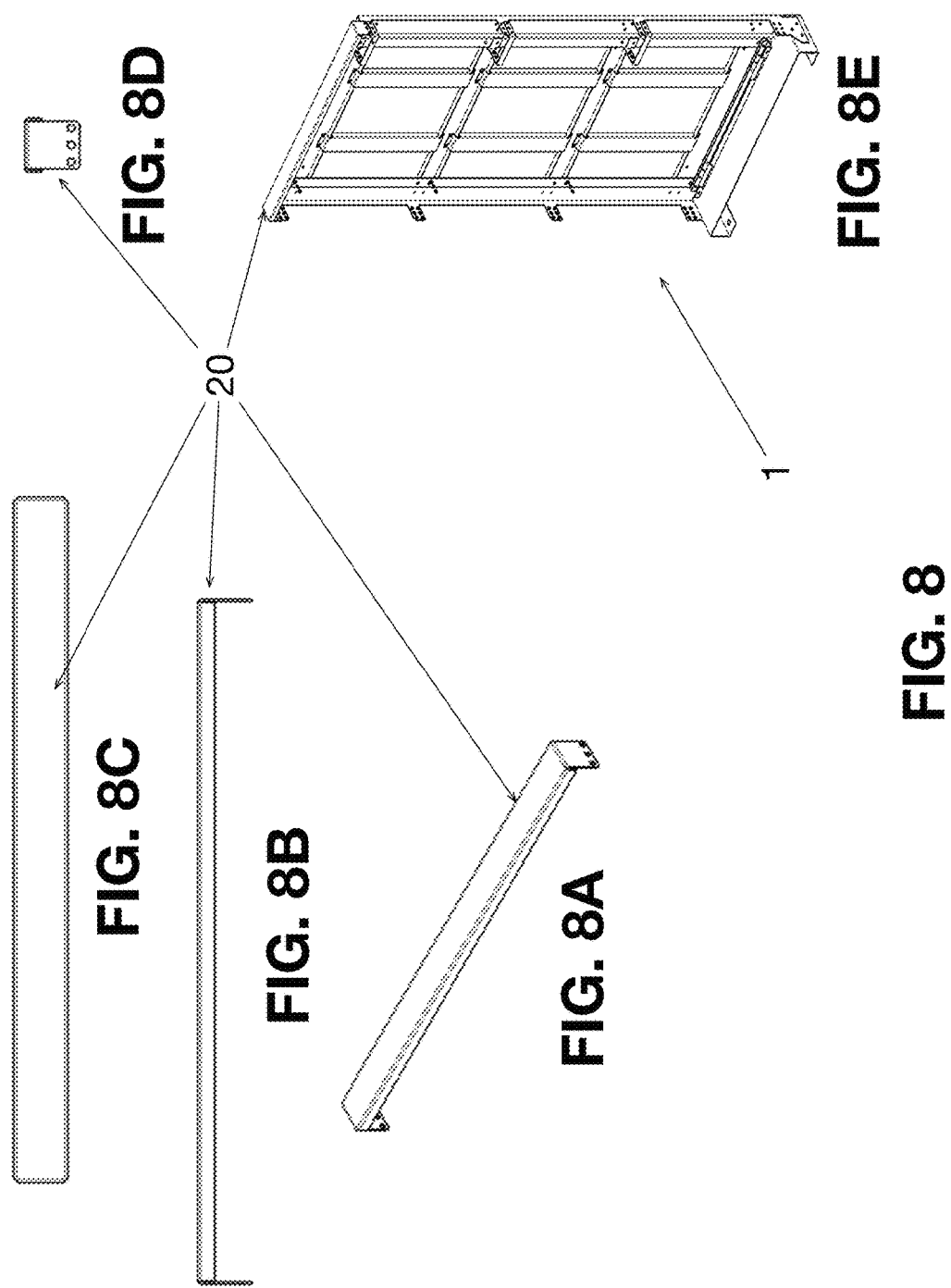
Figure 9:
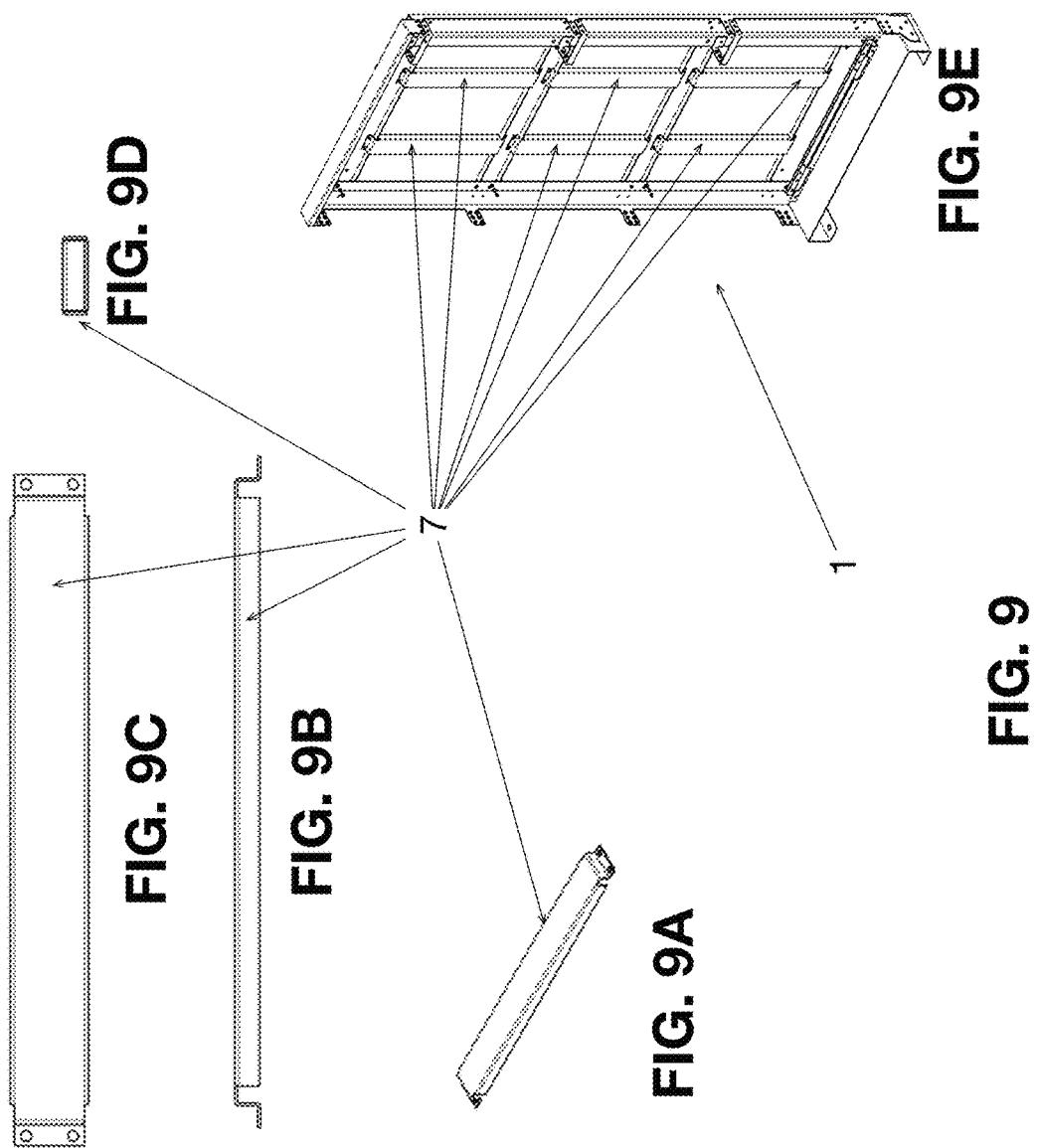
Figure 10:
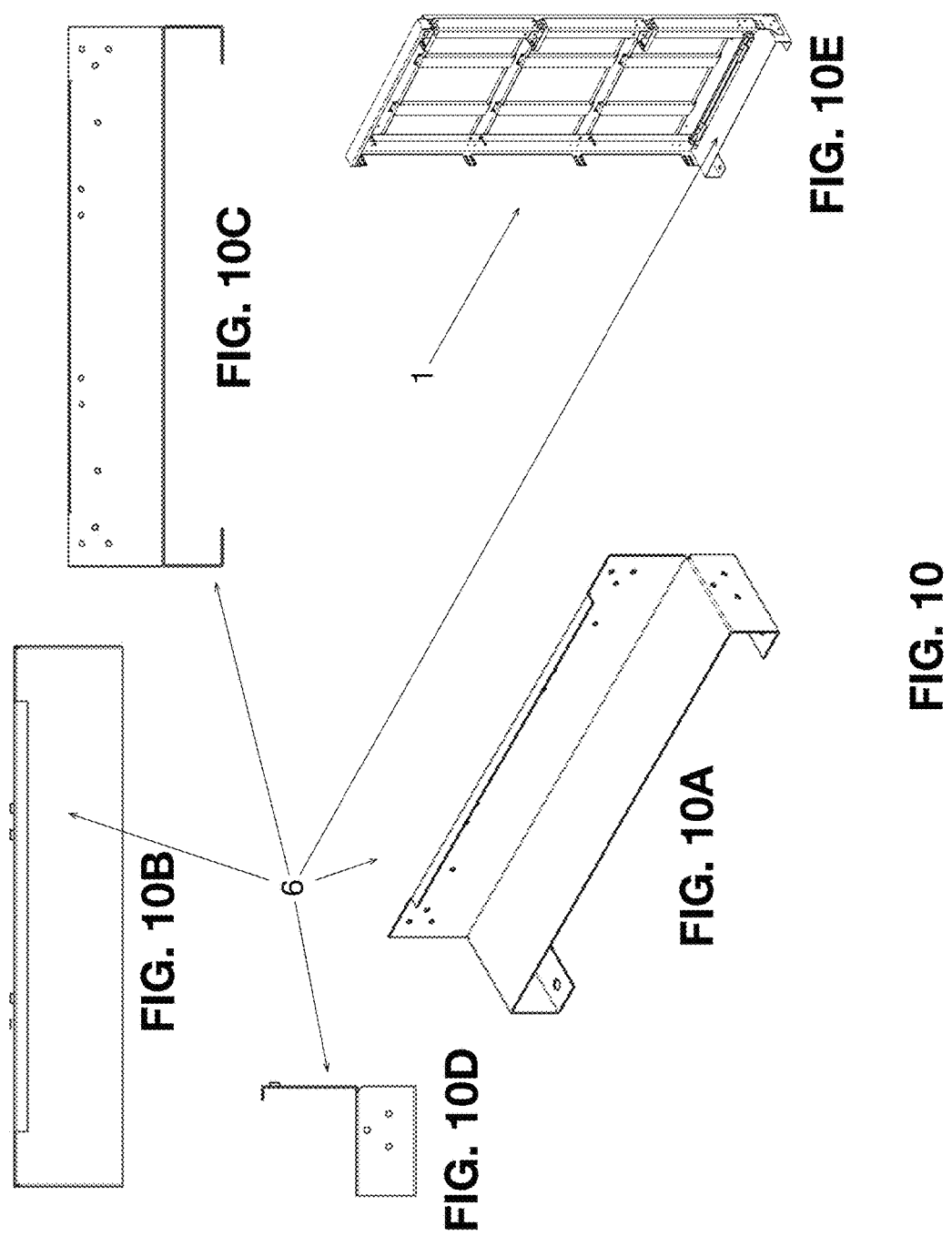
Figure 11:
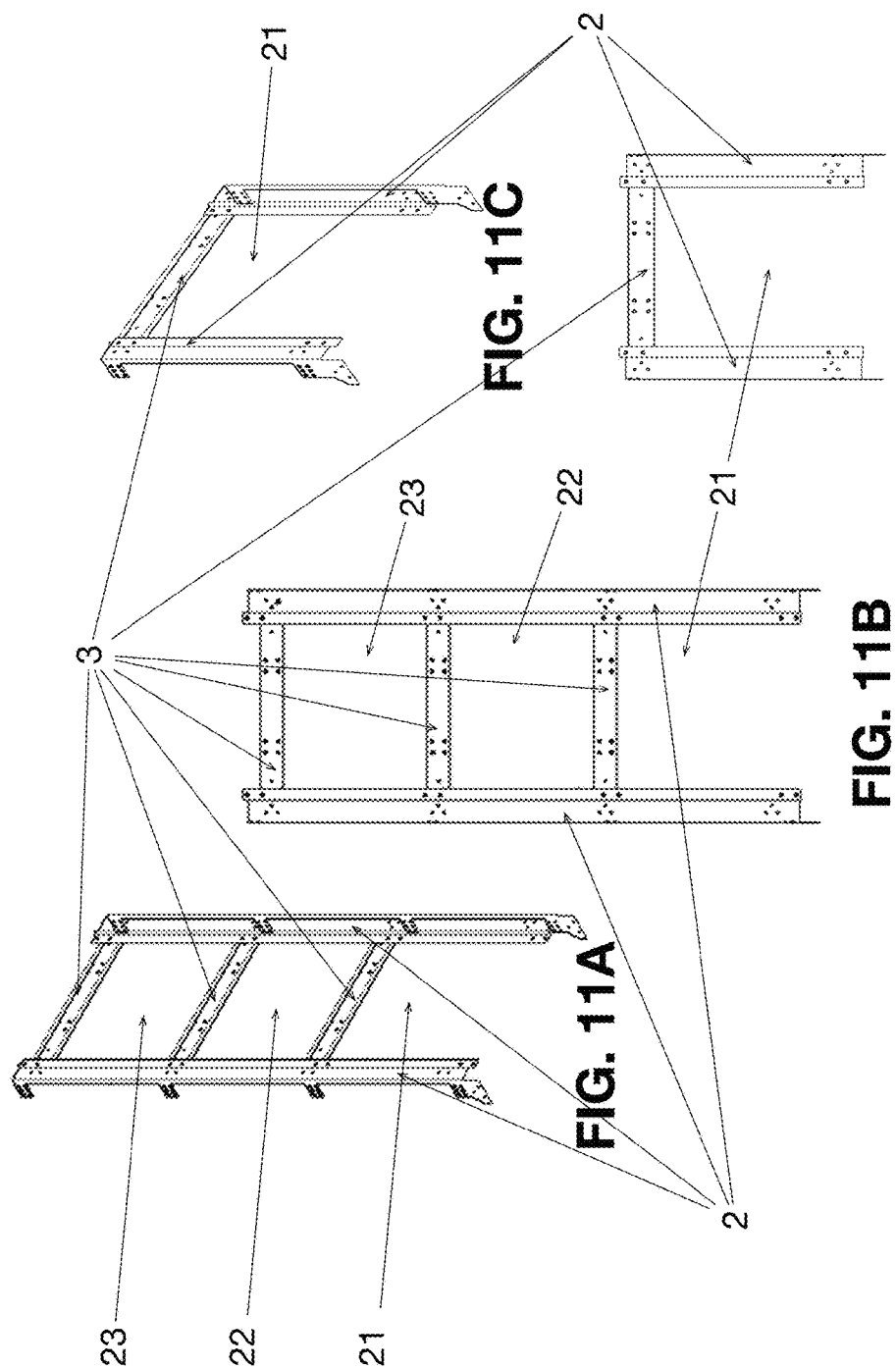

With reference to FIG. 1A, FIG. 7, FIG. 7A, FIG. 7B, FIG. 7C, FIG. 7D, and FIG. 7E, the rack 1 comprises at least two vertical posts 2 that enable the rack 1 to be mounted on a vertical flat surface such as a wall. Preferably, the vertical posts 2 are substantially parallel to each other. The vertical posts 2 preferably may be securely anchored to a wall. If wall mounting is not available, then optionally, the rack 1 may further comprise feet 13, as shown in FIG. 1, or wheels 14, as shown in FIG. 1A, to provide for a free-standing rack 1 solution that either is stationary or mobile, respectively. The vertical posts 2 provide stabilization to the rack 1 which prevents an electronic equipment component as mounted on the rack 1 from twisting or bending vertically. The rack 1 will always comprise at least two vertical posts 2. With reference to FIG. 2, the vertical posts 2 are engineered to attach to at least a horizontal rail 3 for each electronic equipment component, such as a server or similarly weighted component, mounted to the rack 1. The vertical posts 2 also are engineered to allow for secure attachment of the vertical posts 2 both to a channel rail 4, as shown in FIG. 4, and a horizontal rail 3, as shown in FIG. 6, to stabilize the rack 1, and additionally, with reference to FIG. 2, the vertical posts 2 also are engineered to allow for secure attachment of the vertical posts 2 to a base 6 to enable the rack 1 to be optionally free-standing.

With reference to FIG. 2, FIG. 2A, FIG. 2B, FIG. 2C, FIG. 2D, FIG. 6, FIG. 6A, FIG. 6B, FIG. 6C, FIG. 6DB, FIG. 6E, FIG. 11, FIG. 11A, FIG. 11B, FIG. 11C, FIG. 11D and FIG. 11E, the rack 1 consists of at least a horizontal rail 3, wherein the horizontal rail is attached substantially perpendicular to each of the at least two vertical posts 2 and enables the vertical posts 2 to be related securable to one another in a parallel configuration. The horizontal rails 3 provide stabilization for the rack 1 and prevent bending and twisting of the rack 1, and in turn any electronic equipment component mounted thereon, in both the horizontal and vertical planes. In addition, the horizontal rail 3 provides a secure mounting surface to which to attach a hardware rail 7. The hardware rail 7 enables non-Standard Width electronic equipment, as well as a horizontal cable management means 11 and a vertical cable management means 12 to be mounted on the rack 1. The horizontal cable management means 11 and the vertical cable management means 12 may be used to contain therewith any sort of cable used to interconnect electronic equipment components mounted on the rack 1 to each other or to a data source, such as Internet or telephony access, or to a power source. The horizontal cable management means 11 and the vertical cable management means 12 may be partially or fully enclosed or open, or may be fully enclosed, and may be of any suitable configuration, such as a pipe or a box or a fastenable restraint, to contain or run through cabling therein.

With reference to FIG. 2, FIG. 2A, FIG. 2B, FIG. 2C, FIG. 2D and FIG. 4, the rack 1 has at least two channel rails 4 for every standard server chassis attached to the rack 1 and the channel rails 4 are horizontal in orientation and attached perpendicular to each of the at least two vertical posts 2. The channel rail 4 enables electronic equipment, such as servers or other electronic equipment to be mounted in a vertical position on the rack 1. A channel rail 4 has sufficient mass and strength to bear the weight of any electronic equipment mounted on the rack 1. As shown in FIG. 4A, FIG. 4B, FIG. 4C, FIG. 4D, FIG. 4E and FIG. 4F, a channel rail 4 also has at least a channel or groove therein and at least a notch and a lip thereon to retain and to prevent any equipment mounted on the rack 1 from coming off a pair of channel rails 4 securing the equipment to the rack 1. A channel rail 4 can be installed at predetermined locations on rack 1. A channel rail 4 can handle the weight of a fully equipped server, such as a standard rackable 1U-3U server chassis (wherein "U" designates a "unit of measure" of a standard server chassis as commonly understood in the industry), or as much as approximately 200 pounds of electronic equipment, mounted on the rack 1. Furthermore, a channel rail 4 is attached to the vertical posts 2 on rack 1 and to a top of a server 15 or other electronic equipment in order to distribute the lateral forces bearing upon the electronic equipment mounted on the rack 1.

The channel rail 4 also acts as a weight distribution bar and is constructed such that a pin-retainer 5, as shown in FIG. 5, FIG. 5A, FIG. 5B, FIG. 5C, and FIG. 5D, is inserted into and spring loaded within the channel rail 4 to secure a mounting apparatus (or server pins) of a standard server chassis or other Standard Width electronic equipment to or within the channel 4.

With reference to FIG. 10, FIG. 10A, FIG. 10B, FIG. 10C, FIG. 10D and FIG. 10E, the rack 1 further has a stabilization base 6. The base 6 is of sufficient strength to provide stability for the rack 1 and is substantially perpendicularly attached to a bottom end of the vertical posts 2. The base 6 supports the entire weight of the rack 1 and the equipment mounted on the rack 1. Further, with reference to FIG. 2B, the base 6 and the vertical posts 2 operate in unison to transfers the entire weight through a weight distribution configuration mechanism; wherein a bottom attachment tab 25 at a bottom of the vertical post 2 may be a different configuration than the other attachment tabs 25, such that the bottom attachment tab 25 extends to and over and attaches to the sides of the base 6; and the weight distribution configuration mechanism prevents the vertical posts 2 from bending forward or buckling under stress, such as an earthquake.

With reference to FIG. 9, FIG. 9A, FIG. 9B, FIG. 9C, FIG. 9D and FIG. 9E, the rack 1 also has at least an hardware rail 7 which attaches to the horizontal rail 3. The hardware rail 7 is used to fasten a component of electronic equipment to the rack 1 via the vertical posts 2 and the horizontal rail 3. The hardware rail 7 also provides vertical stabilization for the electronic equipment mounted upon the rack 1.

As shown in FIG. 2 and FIG. 2B, the rack 1 also has at least two channel rails 4 to mount a standard server or other electronic equipment component that is housed in a standard rack mount chassis. The pin-retainer 5 is securely attached to the channel rail 4 by a spring-loaded mechanism and mounting hardware such as screws or any other suitable attachment means. The channel rails 4 also substantially perpendicularly and securely attach to the vertical posts 2. The channel rails 4 and pin-retainer 5 mounting hardware are the means by which weight is transferred from the channel rail 4 to the vertical posts 2.

As can be seen in FIG. 2C, the vertical post 2 has at least an attachment tab 25 to which can be attached a standard server or other electronic equipment housed in a standard rack mount chassis by using mounting hardware provided with the electronic equipment. With reference to FIG. 3, FIG. 3A, FIG. 3B, FIG. 3C, FIG. 3D, FIG. 3E and FIG. 3F, the attachment tabs 25 on the vertical post 2 also allow for attachment of an optional mounting apparatus side extension 8 which provides additional mounting options for standard rack mount network chassis; wherein the weight distribution is through the side extension 8 and vertical post 2, as opposed to through the channel rail 4. The side extension 8 may support less than or equal to approximately 100 pounds.

With reference to FIG. 1C, FIG. 8, FIG. 8A, FIG. 8B, FIG. 8C, FIG. 8D and FIG. 8E, a top bar 20 is shown and the top bar 20 is substantially perpendicularly attached to a bottom end of the vertical posts 2. The purpose of the top bar 20 is to provide stiffening of the vertical posts 2 under lateral stress to the rack 1. Further, the top bar 20 may be used to mount additional electronic equipment components, such as a monitor, on the rack 1. With reference to FIG. 12D, in a one bay configuration of the rack 1 which may be wall mounted, the top bar 20 may also be used in an interchangeable or mirror configuration as a bottom bar on the rack 1 in place of a base 6.

Alternative embodiments of the rack 1 of the present invention are shown in FIG. 12 which are different rack 1 size configurations comprising a four bay (FIG. 12A), a three bay (FIG. 12B), a two bay (FIG. 12C), and a single or one bay (FIG. 12D), wherein the different rack 1 size configurations allow a user to choose a rack 1 configuration best suited to the user's electronic equipment mounting and stacking needs and the physical space requirements or constraints where the rack 1 will be used. Furthermore, the one bay (FIG. 12D) and the two bay (FIG. 12C) rack 1 configurations can be provided with an alternate base (not shown) to the standard base 6, so as to mount the rack 1 directly to a horizontal surface, such as a wall or an internal side of a vehicle, and transferring all the weight of the rack 1 and components mounted thereon to the horizontal surface. In addition, all configurations of the rack 1 of the present invention can be configured with alternative weight transference means and replacing the base 6 for such purpose. This enables rack 1 of the present invention to be mounted inside fixed or movable walls such as standard cubicle walls, doors, and other areas where physical space is limited or constrained.

Optionally and not shown, the rack 1 may be have a cover to protect the electronic equipment components mounted on the rack 1 and the cover may be partially or wholly cover or encase the rack 1 as a user may desire. The cover may be transparent or opaque and may be made of any suitable material of a user's choice, such as glass, plexiglass, wood or the like. The cover may also be designed to be or have the appearance of a user's choice, such as a cabinet, artwork or the like.

Although the present invention has been described with reference to specific embodiments, it is understood that modifications and variations of the present invention are possible without departing from the scope of the invention, which is defined by the claims set forth below. Unless defined otherwise, all technical and scientific terms used herein have the same meaning as commonly understood by one of ordinary skill in the art to which this invention belongs. Any methods and materials similar or equivalent to those described herein can also be used in the practice or testing of the present invention; however, the preferred methods and materials are described.

The invention claimed is:

1. An electronic equipment vertical mount and stack rack comprising:
   a. At least two vertical posts, wherein the vertical posts are substantially parallel to each other;
   b. At least a horizontal rail, wherein the horizontal rail is substantially perpendicularly attached to each of the vertical posts, further wherein the vertical posts and horizontal rail form an electronic equipment vertical mount and stack rack; and
   c. At least two channel rails, wherein each channel rail is substantially perpendicularly attached to each of the vertical posts;
   wherein the vertical posts, horizontal rail and channel rails are configured to form a rack with at least a bay; and
   further wherein the rack is capable of having mounted thereon at least an electronic equipment component oriented and mounted in a vertical orientation on the rack by means of the channel rails, such that the component's typical z-axis is substantially parallel to and in a same plane as the rack's x-axis and the component's typical x-axis is substantially parallel to and in a same plane as the rack's y-axis; and
   further wherein the rack is capable of having mounted thereon at least another electronic equipment component which is vertically stacked on the rack in relation to the other mounted electronic equipment component.

2. The electronic equipment vertical mount and stack rack of claim 1; wherein the channel rail further comprises at least a groove, at least a notch and at least a lip to retain an electronic equipment component mounted on the channel rail.

3. The electronic equipment vertical mount and stack rack of claim 2 further comprising a pin-retainer inserted into and spring loaded within the channel rail to secure a mounting apparatus of a Standard Width electronic equipment component to the channel rail.

4. The electronic equipment vertical mount and stack rack of claim 1 further comprising a base; wherein the base is substantially perpendicularly attached to each of the vertical posts at a bottom end of the vertical posts.

5. The electronic equipment vertical mount and stack rack of claim 4 further comprising at least two wheels; wherein the wheels are attached to the base and provide for mobility of the rack.

6. The electronic equipment vertical mount and stack rack of claim 1 further comprising a top; wherein the top is substantially perpendicularly attached to each of the vertical posts at a top end of the vertical posts.

7. The electronic equipment vertical mount and stack rack of claim 6; wherein the top is capable of having at least an electronic equipment component mounted thereon.

8. The electronic equipment vertical mount and stack rack of claim 1 further comprising at least a hardware rail attached to the horizontal rail; wherein the hardware rail is capable of having mounted thereon at least a non-Standard Width electronic equipment component.

9. The electronic equipment vertical mount and stack rack of claim 8 further comprising at least a vertical cable management means attached to the hardware rail.

10. The electronic equipment vertical mount and stack rack of claim 8 further comprising at least a horizontal cable management means attached to the hardware rail.

11. The electronic equipment vertical mount and stack rack of claim 1; wherein the vertical post further comprises at least an attachment tab and the rack further comprises at least a side extension attached to the attachment tab; further wherein the side extension is capable of having mounted thereon an electronic equipment component.

12. The electronic equipment vertical mount and stack rack of claim 1 further comprising at least a patch panel mount; wherein the patch panel mount is capable of having a patch panel mounted thereon.

13. The electronic equipment vertical mount and stack rack of claim 1 further comprising at least a hardware mount wherein the hardware mount is capable of having at least an electronic equipment component mounted thereon.

14. The electronic equipment vertical mount and stack rack of claim 1; wherein the rack can accommodate in a vertical orientation at least an electronic equipment component selected from the group consisting of a standard server chassis, a standard telecommunications chassis and a standard networking chassis, which chassis is horizontally oriented and adheres to either an Electronic Industries Alliance EIA-310-D standard or a Consumer Electronics Association CEA-310-E standard without modification to said chassis.

15. An electronic equipment vertical mount and stack rack comprising:
  a. At least two vertical posts, wherein the vertical posts are substantially parallel to each other;
  b. At least a horizontal rail, wherein the horizontal rail is substantially perpendicularly attached to each of the vertical posts, further wherein the vertical posts and horizontal rail form an electronic equipment vertical mount and stack rack;
  c. At least two channel rails, wherein each channel rail is substantially perpendicularly attached to each of the vertical posts;
  d. A base; wherein the base is substantially perpendicularly attached to each of the vertical posts at a bottom end of the vertical posts; and
  e. A top; wherein the top is substantially perpendicularly attached to each of the vertical posts at a top end of the vertical posts;
    wherein the vertical posts, horizontal rail, channel rails, base and top are configured to form a rack with at least a bay;
    further wherein the rack is capable of having mounted thereon at least an electronic equipment component oriented and mounted in a vertical orientation on the rack by means of the channel rails, such that the component's typical z-axis is substantially parallel to and in a same plane as the rack's x-axis and the component's typical x-axis is substantially parallel to and in a same plane as the rack's y-axis; and
    further wherein the rack is capable of having mounted thereon at least another electronic equipment component which is vertically stacked on the rack in relation to the other mounted electronic equipment component.

16. The electronic equipment vertical mount and stack rack of claim 15; wherein the channel rail further comprises at least a groove, at least a notch and at least a lip to retain an electronic equipment component mounted on the channel rail.

17. The electronic equipment vertical mount and stack rack of claim 16 further comprising a pin-retainer inserted into and spring loaded within the channel rail to secure a mounting apparatus of a Standard Width electronic equipment to the channel rail.

18. The electronic equipment vertical mount and stack rack of claim 15 further comprising at least two wheels; wherein the wheels are attached to the base and provide for mobility of the rack.

19. The electronic equipment vertical mount and stack rack of claim 15 further comprising at least a hardware rail attached to the horizontal rail; wherein the hardware rail is capable of having mounted thereon at least a non-Standard Width electronic equipment component.

20. The electronic equipment vertical mount and stack rack of claim 19 further comprising at least a vertical cable management means attached to the hardware rail.

21. The electronic equipment vertical mount and stack rack of claim 19 further comprising at least a horizontal cable management means attached to the hardware rail.

22. The electronic equipment vertical mount and stack rack of claim 15; wherein the top is capable of having at least an electronic equipment component mounted thereon.

23. The electronic equipment vertical mount and stack rack of claim 15; wherein the vertical post further comprises at least an attachment tab and the rack further comprises at least a side extension attached to the attachment tab; further wherein the side extension is capable of having mounted thereon an electronic equipment component.

24. The electronic equipment vertical mount and stack rack of claim 15 further comprising at least a patch panel mount; wherein the patch panel mount is capable of having a patch panel mounted thereon.

25. The electronic equipment vertical mount and stack rack of claim 15 further comprising at least a hardware mount wherein the hardware mount is capable of having at least an electronic equipment component mounted thereon.

26. The electronic equipment vertical mount and stack rack of claim 15; wherein the rack can accommodate in a vertical orientation at least an electronic equipment component selected from the group consisting of a standard server chassis, a standard telecommunications chassis and a standard networking chassis, which chassis is horizontally oriented and adheres to either an Electronic Industries Alliance EIA-310-D standard or a Consumer Electronics Association CEA-310-E standard without modification to said chassis.

27. An electronic equipment vertical mount and stack rack comprising:
   a. At least two vertical posts, wherein the vertical posts are substantially parallel to each other;
   b. At least a horizontal rail, wherein the horizontal rail is substantially perpendicularly attached to each of the vertical posts, further wherein the vertical posts and horizontal rail form an electronic equipment vertical mount and stack rack;
   c. At least two channel rails, wherein each channel rail is substantially perpendicularly attached to each of the vertical posts; and
   d. A pin-retainer inserted into and spring loaded within the channel rail to secure a mounting apparatus of a Standard Width electronic equipment to the channel rail;
   wherein the vertical posts, horizontal rail and channel rails are configured to form a rack with at least a bay;
   further wherein the rack is capable of having mounted thereon at least an electronic equipment component oriented and mounted in a vertical orientation on the rack by means of the channel rails, such that the component's typical z-axis is substantially parallel to and in a same plane as the rack's x-axis and the component's typical x-axis is substantially parallel to and in a same plane as the rack's y-axis; and
   further wherein the rack is capable of having mounted thereon at least another electronic equipment component which is vertically stacked on the rack in relation to the other mounted electronic equipment component.

* * * * *